United States Patent
Yang et al.

(10) Patent No.: US 9,261,779 B2
(45) Date of Patent: Feb. 16, 2016

(54) PHOTORESIST COMPOSITION AND METHOD OF PREPARING THE SAME, COLOR FILM SUBSTRATE, AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Tonghua Yang, Beijing (CN); Hongjiang Wu, Beijing (CN); Changgang Huang, Beijing (CN); Jianfeng Yuan, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/381,514

(22) PCT Filed: Dec. 20, 2013

(86) PCT No.: PCT/CN2013/090023
§ 371 (c)(1),
(2) Date: Aug. 27, 2014

(87) PCT Pub. No.: WO2015/007062
PCT Pub. Date: Jan. 22, 2015

(65) Prior Publication Data
US 2015/0168827 A1 Jun. 18, 2015

(30) Foreign Application Priority Data
Jul. 15, 2013 (CN) .......................... 2013 1 0295781

(51) Int. Cl.
| | | |
|---|---|---|
| G03F 7/028 | (2006.01) | |
| G03F 7/00 | (2006.01) | |
| G02F 1/1335 | (2006.01) | |
| G03F 7/027 | (2006.01) | |
| G02B 1/04 | (2006.01) | |
| G02B 5/23 | (2006.01) | |
| G03F 7/004 | (2006.01) | |
| G03F 7/038 | (2006.01) | |
| B01J 13/02 | (2006.01) | |

(52) U.S. Cl.
CPC *G03F 7/002* (2013.01); *G02B 1/04* (2013.01); *G02B 5/23* (2013.01); *G02F 1/1335* (2013.01); *G03F 7/0042* (2013.01); *G03F 7/027* (2013.01); *G03F 7/038* (2013.01); *B01J 13/02* (2013.01)

(58) Field of Classification Search
None
See application file for complete search history.

(56) References Cited

U.S. PATENT DOCUMENTS

| | | | | | |
|---|---|---|---|---|---|
| 4,588,639 | A | * | 5/1986 | Ozono | 428/402.22 |
| 4,623,607 | A | * | 11/1986 | Hosogai | 430/312 |
| 4,957,843 | A | * | 9/1990 | Hipps et al. | 430/138 |
| 5,095,379 | A | * | 3/1992 | Fukunaga et al. | 349/192 |
| 5,561,029 | A | * | 10/1996 | Fitzgerald et al. | 430/281.1 |
| 5,750,304 | A | * | 5/1998 | Yamaguchi et al. | 430/110.1 |
| 2003/0203458 | A1 | * | 10/2003 | Kozaki et al. | 435/135 |
| 2004/0007784 | A1 | * | 1/2004 | Skipor et al. | 257/788 |
| 2015/0030843 | A1 | * | 1/2015 | Yang et al. | 428/327 |

FOREIGN PATENT DOCUMENTS

| | | |
|---|---|---|
| CN | 101059655 A | 10/2007 |
| CN | 101382673 A | 3/2009 |
| CN | 102773053 A | 11/2012 |
| CN | 103376657 A | 10/2013 |
| JP | 02-244051 A | 9/1990 |
| JP | 2005-234532 A | 9/2005 |

OTHER PUBLICATIONS

"Sorbitan-Wikipedia, the free encylcopedia" from https://en.wikipedia.org/wiki/Sorbitan, 2 pages downloaded Jun. 19, 2015.*
"tween: definition of tween in Oxford dictionary" website of http://www.oxforddictionaries.com/us/definition 13 pages downloaded Jun. 19, 2015.*
English translation of CN 101059655 A downloaded Jun. 20, 2015 from GPSN website, 97 pages.*
English translation of CN 102773053 A downloaded Jun. 20, 2015 from European patent office website, 14 pages.*
English translation of CN 101382673 A obtained Jan. 4, 2016 from ProQuest Dialog online machine translation, 18 pages.*
International Search Report Appln. No. PCT/GN2013/090023; Dated Apr. 25, 2014.
Written Opinion of the International Searching Authority dated Apr. 14, 2014; PCT/CN2013/090023.
First Chinese Office Action Appln. No. 201310295781.7; Dated Jan. 7, 2015.
Second Chinese Office Action dated Jun. 3, 2015; Appln. No. 201310295781.7.
Third Chinese Office Action dated Nov. 20, 2015; Appin. No. 201310295781.7.

* cited by examiner

*Primary Examiner* — Cynthia Hamilton
(74) *Attorney, Agent, or Firm* — Ladas & Parry LLP

(57) ABSTRACT

An auto-repairing photoresist composition comprises 1 to 10 wt % of microcapsule having a capsule wall and a capsule core based on the total weight of the photoresist composition, wherein the capsule wall includes an alkali-insoluble resin, and the capsule core includes: 10 to 60 wt % of a photocurable unsaturated resin oligomer; 10 to 50 wt % of a photocurable monomers; 10 to 70 wt % of a first black pigment paste; 0.1 to 10 wt % of a first photo-initiator; and 0.1 to 5 wt % of a coupling agent, based on the total weight of the capsule core. The photoresist composition of embodiments of the present invention can be used for preparation of Black Matrix, and has an auto-repairing property to improve substantially the pass yield of product. A method of preparing the photoresist composition, a color filter substrate, and a display apparatus are also disclosed.

13 Claims, 1 Drawing Sheet

PHOTORESIST COMPOSITION AND METHOD OF PREPARING THE SAME, COLOR FILM SUBSTRATE, AND DISPLAY APPARATUS

TECHNICAL FIELD

Embodiments of the present invention relate to a photoresist composition and a method of preparing the same, a color filter substrate, and a display apparatus.

BACKGROUND

In flat panel display apparatuses, Thin Film Transistor Liquid Crystal Display (TFT-LCD) are characterized in small volume, low power consumption, relatively low production cost, no radiation, and the like, and thus predominates in the current market of flat panel displays.

Currently, the primary structure of TFT-LCD comprises an array substrate and a color filter (CF) substrate assembled together. Among others, the color filter substrate comprises primarily a glass substrate, a Black Matrix (BM), a color photoresist, and a protective film. In general, the Black Matrix is arranged in a manner of grating, stripe, or speckle among the color patterns formed from the color photoresist. The primary function of Black Matrix is to improve the contrast by inhibiting the mixing of colors, as well as to provide a shield against stray light so as to prevent the malfunction of TFT caused by light leakage among pixels.

A photoresist composition for Black Matrix undergoes coating, exposure, and development to form Black Matrix. The current photoresist composition for Black Matrix comprises a black pigment paste, photo-polymerizable monomers, photoinitiators, and an organic solvent, wherein the black pigment paste serves primarily to form a black color for preventing light leakage; and the photoinitiators induce a polymerization reaction of the photo-polymerizable monomers under UV radiation to form a polymeric film. The Black Matrix layer is required to possess a high light shielding property. However, BM is commonly prepared in an earlier procedure, which is followed by procedures of preparing the color photoresist, the protective layer, etc. Thus, the process technology of production line, as well as other factors including particles, impurities and the like will affect the BM layer and cause scratching damages leading to light leakage of damages and formation of white defects, thereby affecting the quality of TFT-LCD products. For avoiding such defects, the current process has to comprise a repair procedure after completing the preparation of Black Matrix, as shown in FIGS. 1a to 1c, that is, a schematic flowchart of the current process of preparing Black Matrix. Among others, FIG. 1a indicates that damages appear in some sites after a photoresist composition for Black Photoresist is applied; FIG. 1b indicates that white defects are formed at the damaged sites of the Black Matrix after the photoresist composition for Black Matrix undergoes laser radiation; and FIG. 1c indicates that the formed white defects are repaired by means of a repair procedure which can repair the defects by adding the photoresist composition for Black Matrix onto the damaged sites and allowed the added photoresist composition to be cured.

The current technology has a disadvantage that when white defects appear in the Black Matrix, a specific repair procedure and additional devices are required to add the photoresist composition for Black Matrix, thereby increasing the cost.

SUMMARY OF INVENTION

To address the aforesaid problems, embodiments of the present invention provide an auto-repairing photoresist composition which can auto-repair the damaged sites of Black Matrix, thereby increasing substantially the pass yield of product.

An embodiment of the present invention provides a photoresist composition comprising 1 to 10 wt % of microcapsules having a capsule wall and a capsule core based on the total weight of the photoresist, wherein the capsule wall comprises an alkali-insoluble resin, and the capsule core comprises:

10 to 60 wt % of a photo-curable unsaturated resin oligomer;
10 to 50 wt % of a photo-curable monomer;
10 to 70 wt % of a first black pigment paste;
0.1 to 10 wt % of a first photo-initiator; and
0.1 to 5 wt % of a coupling agent,
based on the total weight of the capsule core.

In an aspect, the photo-curable unsaturated resin oligomer comprises one or more selected from the group consisting of epoxy acrylic resins and polyurethane acrylic resins; the photo-curable monomer comprises one or more selected from the group consisting of dipentaerylthiol hexaacrylate (DPHA), trimethylol propane triacrylate (TMPTA), and pentaerylthiol pentacrylate; the first photo-initiator comprises one or more selected from the group consisting of 2-hydroxy-2-methyl-1-phenyl-1-acetone, 1-hydroxy cyclohexyl phenyl ketone and 2-phenylbenzyl-2-dimethylamino-4'-morpholinopropyl phenyl ketone; the coupling agent comprises one or more selected from the group consisting of γ-(2,3-epoxypropoxy)propyl trimethyl silane and γ-methylacryloyloxy propyl trimethyl silane.

In another aspect, the photoresist composition further comprises:

5 to 70 wt % of a second black pigment paste;
1 to 50 wt % of an adhesive resin containing a carboxyl group;
5 to 50 wt % of a polymerizable monomer containing an olefinc unsaturated bond;
0.1 to 10 wt % of a second photo-initiator,
7.3 to 59.39 wt % of a first solvent; and
0.01 to 5 wt % of an adjuvant,
based on the total weight of the photoresist composition.

Of those, for Example, the adhesive resin containing a carboxyl group comprises a copolymer of methacrylic acid and benzyl methacrylate; the polymerizable monomer containing an olefinic unsaturated bond comprises one or more selected from the group consisting of trimethylol propane triacrylate, dipentaerylthiol hexaacrylate and pentaerylthiol triacrylate; the second photo-initiator comprises one or more selected from the group consisting of 2-phenylbenzyl-2-dimethylamino-4'-morpholinopropyl phenyl ketone and 2-hydroxy-2-methyl-1-phenyl-1-acetone; the first solvent comprises one or more selected from the group consisting of propylene glycol monomethyl ether acetate, ethyl 3-ethoxypropriate and cyclohexanone; and the adjuvant comprises one or more selected from the group consisting of silane coupling agent and leveling agents.

Of those, for Example, the first and the second black pigment pastes comprise, respectively, 1 to 20 wt % of a black pigment;
1 to 50 wt % of a hyperdispersant;
0.5 to 10 wt % of a co-dispersant;
0.1 to 5 wt % of an additive; and
39 to 97.4 wt % of a second solvent,
based on the total weight of the first or the second black pigment paste.

For instance, the black pigment comprises one or more selected from the group consisting of carbon black and titanium black; the hyperdispersant comprises one or more selected from the group consisting of amide-based polymers, block polymers containing a group with affinity to pigment, organosilicon surfactants, modified polyurethanes, and modified polyacrylates; the co-dispersant comprises one or more selected from the group consisting of multiplying agents and solvent-improving co-dispersants; the second solvent is one or more selected from the group consisting of propylene glycol monomethyl ether acetate and ethyl 3-ethoxypropriate; the additive is one or more selected from the group consisting of Tweens and Spans.

In still another aspect, the alkali-insoluble resin comprises an epoxy resin or a polyurethane resin, such as, Epoxy Acrylaic Resin 6118, Epoxy Acrylic Resin 6104, or Polyurethane Acrylate Resin SM6201 manufacture by Sanmu, Jiangsu.

The photoresist composition of the embodiments of the present invention is suitable for used in the preparation of a Black Matrix.

Another embodiment of the present invention provides a method of preparing a photoresist composition comprising: mixing and dispersing 10 to 60 wt % of a photo-curable unsaturated resin oligomer, 10 to 50 wt % of a photo-curable monomer, 10 to 70 wt % of a first black pigment paste, 0.1 to 10 wt % of a first photo-initiator and 0.1 to 5 wt % of a coupling agent, based on the total weight of the capsule core, to produce a composition for capsule core of microcapsules; adding the composition for capsule core of microcapsule dropwise into a resin solution for forming a capsule wall of microcapsule and stirring the mixture to form a microcapsule suspension;
filtering, screening, and curing the microcapsule suspension to give microcapsules; and mixing 1 to 10 wt % of the microcapsules with other components of the photoresist composition based on the total weight of the photoresist composition to form the photoresist composition.

In an aspect, the other components of the photoresist composition comprise: 5 to 70 wt % of a second black pigment paste; 1 to 50 wt % of an adhesive resin containing a carboxyl group; 5 to 50 wt % of a polymerizable monomer containing an olefinic unsaturated bond; 0.1 to 10 wt % of a second photo-initiator; 7.3 to 59.39 wt % of a first solvent; and 0.01 to 5 wt % of an adjuvant, based on the total weight of the photoresist composition.

Still another embodiment of the present invention provides a color filter substrate comprising a Black Matrix formed from the photoresist composition of embodiments of the present invention or prepared in accordance with the method of embodiments of the present invention.

Still another embodiment of the present invention provides a display apparatus comprising the color filter substrate of embodiments of the present invention.

DETAILED DESCRIPTION OF INVENTION

Figure 1A:
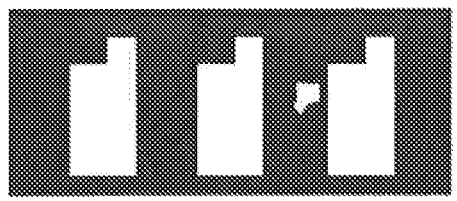
FIGS. 1a to 1c indicate schematic flowcharts of preparing a Black Matrix of the prior art.
Figure 1B:
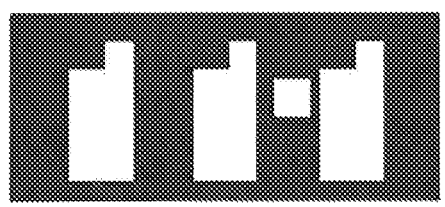
Figure 1C:
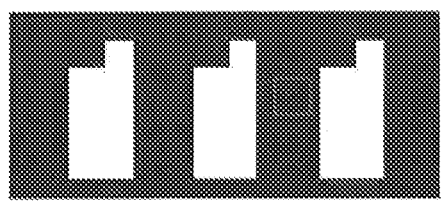
Figure 2A:
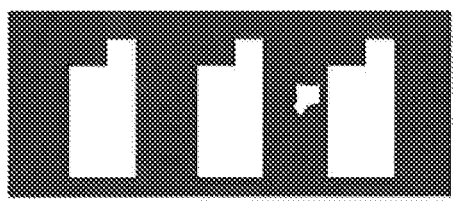
FIGS. 2a to 2b indicates schematic flowcharts of preparing a Black Matrix of the embodiments of the present invention.
Figure 2B:
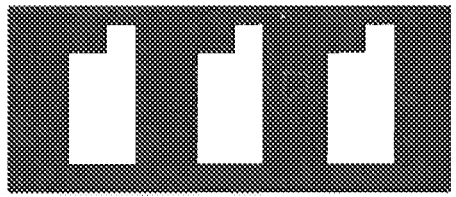

For describing the objects, technical solutions, and advantages of the present invention more clearly, the present invention is further illustrated with reference to the following particular embodiments.

An embodiment of the present invention provides a photoresist composition comprising 1 to 10 wt % of microcapsule having a capsule wall and a capsule core based on the total weight of the photoresist composition, wherein the capsule wall comprises an alkali-insoluble resin and the capsule core comprises:
   10 to 60 wt % of a photo-curable unsaturated resin oligomer;
   10 to 50 wt % of a photo-curable monomer,
   10 to 70 wt % of a first black pigment paste;
   0.1 to 10 wt % of a first photo-initiator; and
   0.1 to 5 wt % of a coupling agent,
based on the total weight of the capsule core.

Based on the total weight of the photoresist composition, the photoresist composition of embodiments of the present invention comprises 1 to 10 wt % of microcapsules. When the concentration of the microcapsules in the photoresist composition is too low, the broken microcapsules may not be sufficient to fill all the white defects if present in the Black Matrix. If the concentration of the microcapsules in the photoresist composition is too high, the cost increases and the incorporation of a large amount of microcapsules may cause undesired waste because the white defects in the Black Matrix prepared by the prior art process may not be too many. The inventor finds, through a large amount of work, when the microcapsules comprise 1 to 10 wt % of the total weight of the photoresist composition, the problem of white defects in the Black Matrix prepared by the prior art process will be addressed.

In an aspect, the photo-curable unsaturated resin oligomer comprises one or more selected from the group consisting of epoxy acrylic resin and polyurethane acrylic resin; the photo-curable monomers comprises one or more selected from the group consisting of dipentaerylthiol hexaacrylate (DPHA), trimethylol propane triacrylate (TMPTA) and pentaerylthiol pentaacrylate (DPPA); the first photo-initiator comprises one or more selected from the group consisting of 2-hydroxy-2-methyl-1-phenyl-1-acetone (P.I.-1173), 1-hydroxycyclohexyl phenyl ketone (P.I.-184) and 2-phenylbenzyl-2-dimethylamino-4'-morpholinopropyl phenyl ketone (P.I.-369); and the coupling agent comprises one or more selected from the group consisting of γ-(2,3-epoxypropoxyl)propyl trimethyl silane (KH-560) and γ-methylacryloyloxy propyl trimethyl silane (KH-570).

In another aspect, the photoresist composition further comprises:
   5 to 70 wt % of a second black pigment paste;
   1 to 50 wt % of an adhesive resin containing a carboxyl group;
   5 to 50 wt % of a polymerizable monomer containing an olefinic unsaturated bond;
   0.1 to 10 wt % of a second photo-initiator,
   7.3 to 59.39 wt % of a first solvent;
   0.01 to 5 wt % of an adjuvant,
based on the total weight of the photoresist composition.

Of those, for Example, the adhesive resin containing a carboxyl group comprises a copolymer of methacrylic acid and benzyl methacrylate; the polymerizable monomer containing an olefinic unsaturated bond comprises one or more selected from the group consisting of trimethylol propane triacrylate, dipentaerylthiol hexaacrylate and pentaerylthiol triacrylate; the second photo-initiator comprises one or more selected from the group consisting of 2-phenylbenzyl-2-dimethylamino-4'-morpholinopropyl phenyl ketone and 2-hydroxy-2-methyl-1-phenyl-1-acetone; the first solvent comprises one or more selected from the group consisting of propylene glycol monomethyl ether acetate, ethyl 3-ethoxypropriate and cyclohexanone; and the adjuvant comprises one or more selected from the group consisting of silane coupling agent and leveling agents.

In an aspect, the first black pigment paste and second black pigment pastes comprise, respectively,
   1 to 20 wt % of black pigment;
   1 to 50 wt % of hyperdispersant;
   0.5 to 10 wt % of co-dispersant;
   0.1 to 5 wt % of additives; and
   39 to 97.4 wt % of second solvent,
based on the total weight of the first or the second black pigment pastes.

Of those, for Example, the black pigment comprises one or more selected from the group consisting of carbon black and titanium black; the hyperdispersant comprises one or more selected from the group consisting of amide-based polymers, block polymers containing a group with affinity to pigment, organosilicon surfactants, modified polyurethanes and modified polyacrylates; the co-dispersant comprises one or more selected from the group consisting of multiplying agents and solvent-improving co-dispersants; the second solvent is one or more selected from the group consisting of propylene glycol monomethyl ether acetate (PGMEA) and ethyl 3-ethoxypropriate; the additive is one or more selected from the group consisting of Tweens and Spans.

In another aspect, the alkali-insoluble resin comprises epoxy resins or polyurethane resins, for Example, Epoxy Acrylic Resin 6118, Epoxy Acrylic Resin 6104, or Polyurethane acrylate SM6201 manufactured by Sanmu, Jiangsu.

Another embodiment of the present invention provides a method of preparing a photoresist composition comprising: mixing and dispersing 10 to 60 wt % of a photo-curable unsaturated resin oligomer, 10 to 50 wt % of a photo-curable monomers, 10 to 70 wt % of a first black pigment paste, 0.1 to 10 wt % of a first photo-initiator and 0.1 to 5 wt % of coupling agent, based on the total weight of the capsule core, to produce a composition for capsule core of microcapsules, wherein the dispersing can be carried out at 800 rpm for 2 to 3 hours;
adding the composition for capsule core dropwise into a resin solution for forming a capsule wall and stirring the mixture to form a microcapsule suspension;
filtering, screening and curing the microcapsule suspension to prepare microcapsules; and mixing 1 to 10 wt % of the microcapsules with other components of the photoresist composition based on the total weight of the photoresist composition to form the photoresist composition.

In an aspect, the other components of the photoresist composition comprises 5 to 70 wt % of a second black pigment paste, 1 to 50 wt % of an adhesive resin containing a carboxyl group, 5 to 50 wt % of a polymerizable monomer containing an olefinic unsaturated bond, 0.1 to 10 wt % of a second photo-initiator, 7.3 to 59.39 wt % of a first solvent and 0.01 to 5 wt % of an adjuvant, based on the total weight of the photoresist composition.

Another embodiment of the present invention further provides a color filter substrate comprising a Black Matrix prepared from the photoresist composition of embodiments of the present invention or prepared in accordance with the method of embodiments of the present invention.

Still another embodiment of the present invention further provides a display apparatus comprising the aforesaid color filter substrate. The display apparatus can be any product or part having a display function, such as, liquid crystal panels, electronic papers, OLED panels, liquid crystal televisions, liquid crystal displays, digital frames, mobile phones, tablet computers, or the like.

The photoresist composition of embodiments of the present invention comprises microcapsules having a capsule wall and a capsule core. During the preparing of the photoresist composition, the materials within the capsule core are hard to discharge due to the protection of the capsule wall. However, during the preparation of the Black Matrix from the photoresist composition, the Black Matrix will be damaged in the presence of containment particles or due to the scratching by external force. At that time, the shear force caused by such damages will force the capsule wall of microcapsules to be broken so that the composition within the capsule core discharges and fills the damaged sites. When the prepared Black Matrix is treated with light radiation, the photo-curable unsaturated resin oligomer and the photo-curable monomers within the discharged materials from the capsule core are polymerized in the presence of the photo-initiator to auto-repair the damages, thereby keeping the completeness of the Black Matrix, preventing from light leakage, and accordingly improving the pass yield of product. Due to the incorporation of microcapsules into the photoresist composition for Black Matrix, it is possible to omit the subsequent procedure of repairing the Black Matrix, save the production time of products, and increasing the production efficiency of products. Furthermore, it can save the production cost because the additional incorporation of a photoresist composition for Black Matrix can be omitted.

Hereinafter the photoresist composition and the method of preparing the same of embodiments of the present invention are further illustrated with reference to the particular examples, but the present invention is not limited to the following examples.

I. Preparation of the First and the Second Black Pigment Pastes

Examples 1 to 5 involve the preparation of black pigment pastes, and the components and weight percents of the pigment pastes are listed in Table 1 below. The prepared black pigment pastes are respectively used as the first or the second black pigment pastes in the following examples in accordance with the practical requirement. In accordance with the components and weight percents of Examples 1 to 5 as listed in Table 1, 1 to 20 wt % of the black pigment, 1 to 50 wt % of the hyperdispersant, 0.5 to 10 wt % of the co-dispersant, 0.1 to 5 wt % of the additive and 39 to 97.4 wt % of the second solvent, based on the total weight of the black pigment paste, were mixed and then ground by the steps of: adding the aforesaid components into to a 500-L grinding cylinder, followed by adding 350 mL (volume) of zirconium beads having a particle diameter of 0.5 mm; grinding the resultant mixture at 2,500 rpm for 6 h; and removing the zirconium beads by filtration with screen mesh to give the black pigment paste.

In these Examples, the black pigment was carbon black; the hyperdispersant was block polymer containing a group with affinity to pigment, such as, BYK-163 commercially available from BYK, German and EFKA 4560, EFKA 4030 or EFKA 4040 commercially available from EFKA, holand; the co-dispersant was a multiplying agent and a solvent-improving co-dispersant; the multiplying agent was particularly Solsperse 5000; the solvent-improving co-dispersant was particularly BYK 2105 or BYK 2100 commercially available from BYK, German; the additive was Tween or Span; and the second solvent was propylene glycol monomethyl ether acetate (PGMEA) and ethyl 3-ethoxypropriate.

TABLE 1

Components and Weight percents of Black Pigment pastes of Example 1 to 5

| Components and Weight percents of Black Pigment paste | Example 1 | Example 2 | Example 3 | Example 4 | Example 5 |
|---|---|---|---|---|---|
| carbon black | 1 wt % | 5 wt % | 10 wt % | 15 wt % | 20 wt % |
| hyperdispersant | 1 wt % BYK-163 | 50 wt % BYK-163 | 20 wt % EFKA 4560 | 40 wt % EFKA 4030 | 15 wt % EFKA 4040 |
| co-dispersant | 0.5 wt % Solsperse 5000 | 2 wt % Solsperse 5000 | 5 wt % BYK 2105 | 5 wt % BYK 2100 | 10 wt % Solsperse 22000 |
| the second solvent | 97.4 wt % PGMEA | 42 wt % PGMEA | 64.5 wt % PGMEA | 20 wt % PGMEA 19 wt % ethyl 3-ethoxypropriate | 50 wt % PGMEA |
| additive | 0.1 wt % Tween 80 | 1 wt % Tween 20 | 0.15 wt % Span 20 0.35 wt % Tween 60 | 0.3 wt % Span 20 0.7 wt % Tween 80 | 3 wt % Span 20 2 wt % Tween 80 |

II. Preparation of Composition for Capsule Core of Microcapsules

Example 6 to 10 are directed to the preparation of the composition for capsule core of microcapsules, and the components and weight percents thereof are listed in Table 2 below. In accordance with Examples 6 to 10 in Table 2, 10 to 60 wt % of a photo-curable unsaturated resin oligomer, 10 to 50 wt % of a photo-curable monomers, 10 to 70 wt % of a first black pigment paste, 0.1 to 10 wt % of a first photo-initiator and 0.1 to 5 wt % of a coupling agent, based on the total weight of the capsule core, were mixed to form a mixture. Of those, the photo-curable unsaturated resin oligomer was commercially available from Sanmu Corporation, Jiangsu; the photo-curable monomers was one or more selected from the group consisting of dipentaerylthiol hexaacrylate (DPHA), trimethylol propane triacrylate (TMPTA) or pentaerylthiol pentaacrylate (DPPA); the first photo-initiator was one or more of 2-hydroxy-2-methyl-1-phenyl-1-acetone (P.I.-1173), 1-hydroxycyclohexyl phenyl ketone (P.I.-184) and 2-phenylbenzyl-2-dimethylamino-4'-morpholinopropyl phenyl ketone (P.I.-369); and the coupling agent was a silane coupling agent, such as, γ-(2,3-epoxypropoxyl)propyl trimethyl silane (KH-560) or γ-methylacryloyloxy propyl trimethyl silane (KH-570).

The mixture was dispersed under stirring at 800 rpm for 2 to 3 h to produce the composition for capsule core of microcapsules, wherein the stirring was mechanical stirring.

III. Preparation of Microcapsules

Example 11 to 14 relate to the preparation of microcapsules, and the components and weight percents thereof are listed in Table 3 below. The above-produced composition for capsule core of microcapsules were added dropwise into a resin solution for forming the microcapsule capsule wall, e.g., a solution of epoxy resin or polyurethane resin in xylane (the components and weight percents were listed in Table 3 below). Due to the polar difference between the capsule core and the capsule wall, phase separation took place. The mixture was mechanically stirred under different rates of, e.g., 200 to 1000 rpm so that the composition for capsule core formed a suspension of particles having different particle diameters in the resin solution. The resultant particle suspension was filtered, screened, dried, and cured, thereby producing microcapsule particles having a particle diameter ranging 10 to 100 nm.

TABLE 2

Components and Weight Percents of Capsule Core of Microcapsules of Example 6 to 10

| Components and Weight Percents of Capsule Core of Microcapsules | Example 6 | Example 7 | Example 8 | Example 9 | Example 10 |
|---|---|---|---|---|---|
| photo-curable unsaturated resin oligomer | 39.4 wt % epoxy acrylic resin 6104 | 10 wt % epoxy acrylic resin 6118 | 30 wt % epoxy acrylic resin 6107 | 12 wt % polyurethane acrylate SM6201 | 60 wt % polyurethane acrylate SM6201 |
| photo-cruable monomers | 50 wt % TMPTA | 29.5 wt % DPHA | 20 wt % DPPA | 12 wt % DPHA | 10 wt % DPHA |
| the first black pigment paste | 10 wt % black pigment paste prepared in Example 2 | 60 wt % black pigment paste prepared in Example 2 | 40 wt % black pigment paste prepared in Example 3 | 70 wt % black pigment paste prepared in Example 3 | 17 wt % black pigment paste prepared in Example 4 |
| the first photo-initiator | 0.5 wt % P.I.-1173 | 0.1 wt % P.I.-184 | 5 wt % P.I.-369 | 3 wt % P.I.-369 | 10 wt % P.I.-369 |
| coupling agent | 0.1 wt % KH-560 | 0.4 wt % KH-560 | 5 wt % KH-560 | 3 wt % KH-570 | 3 wt % KH-570 |

TABLE 3

Components and Weight Percents of Microcapsules in Example 11 to 14

| Components and Weight Percents of Microcapsules | Example 11 | Example 12 | Example 13 | Example 14 |
|---|---|---|---|---|
| composition for capsule core | 5 wt % capsule core of microcapsules prepared in Example 7 | 10 wt % capsule core of microcapsules prepared in Example 7 | 15 wt % capsule core of microcapsules prepared in Example 7 | 20 wt % capsule core of microcapsules prepared in Example 7 |
| resin for capsule wall | 20 wt % epoxy resin | 20 wt % epoxy resin | 30 wt % polyurethane resin | 30 wt % polyurethane resin |
| solvent | 75 wt % xylene | 70 wt % xylene | 55 wt % xylene | 50 wt % xylene |
| stirring rate, rpm | 500 | 600 | 600 | 800 |
| particle diameter of the resultant microcapsules | 75 | 60 | 65 | 45 |

IV. Preparation of Photoresist Composition for Black Matrix

Examples 15 to 19 involve the preparation of the photoresist composition for Black Matrix, and the components and weight percents thereof are listed in Table 4 below. In accordance with Examples 15 to 19 of Table 4, 1 to 10 wt % of microcapsules, 1 to 50 wt % of an adhesive resin containing a carboxyl group, 5 to 50 wt % of a polymerizable monomer containing an olefinic unsaturated bond, a second photo-initiator, 7.3 to 59.39 wt % of a first solvent and 0.01 to 5 wt % of an adjuvant based on the total weight of the photoresist composition were mixed homogeneously to give the photoresist composition for Black Matrix of embodiments of the present invention. Of those, the adhesive resin containing a carboxyl group was a copolymer of methacrylic acid and benzyl methacrylate (with a solid content of 20 wt %); the polymerizable monomer containing an olefinic unsaturated bond was one or more selected from the group consisting of trimethylol propane triacrylate (TMPTA), dipentaerylthiol hexaacrylate (DPHA) and pentaerylthiol triacrylate (DPPA); the second photo-initiator was one or more selected from the group consisting of 2-phenylbenzyl-2-dimethylamino-4'-morpholinopropyl phenyl ketone (P.I.-369) and 2-hydroxy-2-methyl-1-phenyl-1-acetone (P.I.-1173); the first solvent was one or more selected from the group consisting of propylene glycol monomethyl ether acetate (PGMEA), ethyl 3-ethoxypropriate and cyclohexanone; the adjuvant was a silane coupling agent and a leveling agents, wherein the silane coupling agent was particularly KH-560 or KIH-570, and the leveling agents was particularly EFKA-3883 or EFKA-3600 commercially available from EFKA, Holand. Comparative Example 1 to 2 were made in accordance with the same method as Examples 16 to 17, except that no microcapsule was incorporated into the photoresist composition (the weight percent of microcapsules as lost was replaced with solvent).

TABLE 4

Components and Weight Percents Thereof of the Photoresist Composition for Black Matrix of Examples 15 to 19 and Comparative Examples 1 to 2

| Components and Weight Percents Thereof of the Photoresist Composition for Black Matrix | Example 15 | Example 16 | Example 17 | Example 18 | Example 19 | Comparative Example 1 | Comparative Example 2 |
|---|---|---|---|---|---|---|---|
| second black pigment paste | 5 wt % Black pigment paste prepared in Example 3 | 15 wt % Black pigment paste prepared in Example 3 | 20 wt % Black pigment paste prepared in Example 3 | 8 wt % Black pigment paste prepared in Example 3 | 70 wt % Black pigment paste prepared in Example 3 | 15 wt % Black pigment paste prepared in Example 3 | 20 wt % Black pigment paste prepared in Example 3 |
| adhesive resin containing a carboxyl group | 30 wt % copolymer of methacrylic acid and benzyl methacrylate | 20 wt % copolymer of methacrylic acid and benzyl methacrylate | 50 wt % copolymer of methacrylic acid and benzyl methacrylate | 10 wt % copolymer of methacrylic acid and benzyl methacrylate | 1 wt % copolymer of methacrylic acid and benzyl methacrylate | 20 wt % copolymer of methacrylic acid and benzyl methacrylate | 50 wt % a copolymer of methacrylic acid and benzyl methacrylate |
| polymerizable monomer containing an olefinic unsaturated bond | 3 wt % DPHA 2 wt % TMPTA | 8 wt % DPHA 7 wt % TMPTA | 5 wt % DPHA 5 wt % PETA | 40 wt % DPHA 10 wt % PETA | 10 wt % DPHA | 8 wt % DPHA 7 wt % TMPTA | 5 wt % DPHA 5 wt % PETA |
| second photo-initiator | 0.1 wt % P.I.-369 | 2 wt % P.I.-369 | 2 wt % P.I.-369 | 2 wt % P.I.-1173 | 10 wt % P.I.-369 | 2 wt % P.I.-369 | 2 wt % P.I.-369 |
| microcapsule | 0.5 wt % microcapsules prepared in Example 11 | 10 wt % microcapsules prepared in Example 12 | 3 wt % microcapsules prepared in Example 13 | 5 wt % microcapsules prepared in Example 14 | 1 wt % microcapsules prepared in Example 11 | — | — |

TABLE 4-continued

Components and Weight Percents Thereof of the Photoresist Composition
for Black Matrix of Examples 15 to 19 and Comparative Examples 1 to 2

| Components and Weight Percents Thereof of the Photoresist Composition for Black Matrix | Example 15 | Example 16 | Example 17 | Example 18 | Example 19 | Comparative Example 1 | Comparative Example 2 |
|---|---|---|---|---|---|---|---|
| first solvent | 40 wt % PGMEA 19.39 wt % ethyl 3-ethoxypropriate | 27.5 wt % PGMEA 10 wt % ethyl 3-ethoxypropriate | 5 wt % PGMEA 5 wt % ethyl 3-ethoxypropriate | 15 wt % PGMEA 5 wt % cyclohexanone | 7.3 wt % PGMEA | 27.5 wt % PGMEA 20 wt % ethyl 3-ethoxypropriate | 8 wt % PGMEA 5 wt % ethyl 3-ethoxypropriate |
| adjuvants | 0.01 wt % KH-560 | 0.3 wt % KH-560 0.2 wt % EFKA 3883 | 4.5 wt % KH-570 0.5 wt % EFKA 3600 | 4.5 wt % KH-570 0.5 wt % EFKA 3600 | 0.5 wt % KH-570 0.2 wt % EFKA 3600 | 0.3 wt % KH-560 0.2 wt % EFKA 3883 | 4.5 wt % KH-570 0.5 wt % EFKA 3600 |

V. Preparation of Black Matrix

The photoresist compositions for Black Matrix prepared in Example 15 to 19 and Comparative Example 1 to 2 were applied onto a clean glass substrate (370 mm×470 mm), respectively, dried under vacuum for 100 seconds, and then baken on a heating plate at 100° C. for 3 minutes. Next, the photoresist compositions underwent an exposure at an energy of 80 mJ/cm$^2$ in a light exposure machine with a cover having a pattern; then developed in a potassium hydroxide or sodium carbonate developer for 80 seconds; and finally baken in a baking over at 220° C. for 30 minutes, thereby producing the Black Matrix pattern of color filter prepared from the black photoresist compositions of embodiments for the present invention.

VI. Test

For further demonstrating the technical effects of the present invention, the color filter substrates coated with the photoresist compositions for Black Matrix prepared in Example 15 to 19 and Comparative Example 1 to 2 were subject to scratching treatment. The substrates were scratched to form 100 damaged sites have a size of 30 μm to 50 μm, and then stood for 10 min, followed by an exposure treatment (with an exposing energy of 100 mJ/cm$^2$). The film surfaces of the Black Matrix substrate of Example 15 to 19 and Comparative Example 1 to 2 were examined under a 25× optical microscope, and the number of white defects present on the substrates were recorded. The results are listed in Table 5.

TABLE 5

Comparison between numbers of white defects formed after scratching of Example s and Comparative Example s

| | Example 15 | Example 16 | Example 17 | Example 18 | Example 19 | Comparative Example 1 | Comparative Example 2 |
|---|---|---|---|---|---|---|---|
| Number of damaged sites on the films examined under the optical microscope (30 μm to 50 μm) | 100 | 100 | 100 | 100 | 100 | 100 | 100 |
| Number of white defects (30 μm to 50 μm) | 6 | 5 | 5 | 5 | 7 | 100 | 100 |

It can be seen from the above results that scratching caused by external force may cause damages in the Black Matrix. The white defects caused by damages in the Black Matrix prepared in accordance with the prior art process are required to be repaired by using specific repairing procedures. However, although the Black Matrix prepared by using the photoresist composition for Black Matrix of embodiments of the present invention are also damaged, but there are present less white defects, for examples, the defect rate is only around 5 wt % of the defect rate of the current Black Matrix. This is because the shear force caused by damages forces the capsule wall of microcapsules to be broken so that the composition for capsule core of microcapsules discharges and fills the damaged sites, thereby repairing the white defects. When the prepared Black Matrix is treated with light radiation, the photo-curable unsaturated resin oligomer and the photo-curable monomers contained in the discharged capsule core materials are polymerized in the presence of the photo-initiator to repair the damages, thereby keeping the completeness of the Black Matrix, preventing light leakage, and accordingly improving the pass yield of products.

It is apparent that persons skilled in the art can make various modifications and variations for the present invention without departing the spirit and scope of the present invention. Thus, provided that such modifications and variations of the present invention fall within the scope of the claims of the present invention or their equivalences, the present invention is also intended to encompass such modifications and variations.

The invention claimed is:

1. A photoresist composition comprising 1 to 10 wt % of microcapsule having a capsule wall and a capsule core based on the total weight of the photoresist composition, wherein the capsule wall comprises an alkali-insoluble resin, and the capsule core comprises:

10 to 60 wt % of a photo-curable unsaturated resin oligomer;
    10 to 50 wt % of a photo-curable monomers;
    10 to 70 wt % of a first black pigment paste;
    0.1 to 10 wt % of a first photo-initiator; and
    0.1 to 5 wt % of a coupling agent,
    based on the total weight of the capsule core.

2. The photoresist composition of claim 1, wherein
the photo-curable unsaturated resin oligomer comprises one or more selected from the group consisting of epoxy acrylic resin and polyurethane acrylic resin;
the photo-curable monomers comprises one or more selected from the group consisting of dipentaerylthiol hexaacrylate, trimethylol propane triacrylate and dipentaerylthiol pentaacrylate;
the first photo-initiator comprises one or more selected from the group consisting of 2-hydroxy-2-methyl-1-phenyl-1-acetone, 1-hydroxycyclohexyl phenyl ketone and 2-phenylbenzyl-2-dimethylamino-4'-morpholinopropyl phenyl ketone; and
the coupling agent comprises one or more selected from the group consisting of γ-(2,3-epoxypropoxy)propyl trimethyl silane and γ-methylacryloyloxy propyl trimethyl silane.

3. The photoresist composition of claim 2, wherein the photoresist composition further comprises:
5 to 70 wt % of a second black pigment paste;
1 to 50 wt % of an adhesive resin containing a carboxyl group;
5 to 50 wt % of a polymerizable monomer containing an olefinic unsaturated bond;
0.1 to 10 wt % of a second photo-initiator;
7.3 to 59.39 wt % of a first solvent; and
0.01 to 5 wt % of an adjuvant,
based on the total weight of the photoresist composition.

4. The photoresist composition of claim 1, wherein the photoresist composition further comprises:
5 to 70 wt % of a second black pigment paste;
1 to 50 wt % of an adhesive resin containing a carboxyl group;
5 to 50 wt % of a polymerizable monomer containing an olefinic unsaturated bond;
0.1 to 10 wt % of a second photo-initiator;
7.3 to 59.39 wt % of a first solvent; and
0.01 to 5 wt % of an adjuvant,
based on the total weight of the photoresist composition.

5. The photoresist composition of claim 4, wherein
the adhesive resin containing a carboxyl group comprises a copolymer of methacrylic acid and benzyl methacrylate;
the polymerizable monomer containing an olefinic unsaturated bond comprises one or more selected from the group consisting of trimethylol propane triacrylate, dipentaerylthiol hexaacrylate and pentaerylthiol triacrylate;
the second photo-initiator comprises one or more selected from the group consisting of 2-phenylbenzyl-2-dimethylamino-4'-morpholinopropyl phenyl ketone and 2-hydroxy-2-methyl-1-phenyl-1-acetone;
the first solvent comprises one or more selected from the group consisting of propylene glycol monomethyl ether acetate, ethyl 3-ethoxypropriate and cyclohexanone; and
the adjuvants comprises one or more selected from the group consisting of silane coupling agent and leveling agents.

6. The photoresist composition of claim 4, wherein the first black pigment paste and second black pigment paste comprise, respectively,
1 to 20 wt % of a black pigment;
1 to 50 wt % of a hyperdispersant;
0.5 to 10 wt % of a co-dispersant;
0.1 to 5 wt % of an additive; and
39 to 97.4 wt % of a second solvent,
based on the total weight of the first or the second black pigment paste.

7. The photoresist composition of claim 1 wherein the alkali-insoluble resin comprises epoxy resins or polyurethane resins.

8. A color filter substrate comprising a Black Matrix formed by the photoresist composition of claim 1.

9. A display apparatus comprising the color filter substrate of claim 8.

10. A method of preparing a photoresist composition comprising:
mixing and dispersing 10 to 60 wt % of a photo-curable unsaturated resin oligomer, 10 to 50 wt % of a photo-curable monomers, 10 to 70 wt % of a first black pigment paste, 0.1 to 10 wt % of a first photo-initiator, 0.1 to 5 wt % of a coupling agent, based on the total weight of the capsule core, to produce a composition for capsule core of microcapsules;
adding the composition for capsule core of microcapsules dropwise into a resin solution for forming a capsule wall of microcapsules to form a microcapsule suspension;
filtering, screening and curing the microcapsule suspension to produce microcapsules; and
mixing 1 to 10 wt % of microcapsules with other components of the photoresist composition based on the total weight of the photoresist composition to form the photoresist composition.

11. The method of preparing a photoresist composition of claim 10, wherein the other components of the photoresist composition comprise 5 to 70 wt % of a second black pigment paste, 1 to 50 wt % of an adhesive resin containing a carboxyl group, 5 to 50 wt % of a polymerizable monomer containing an olefinic unsaturated bond, 0.1 to 10 wt % of a second photo-initiator, 7.3 to 59.39 wt % of a first solvent and 0.01 to 5 wt % of an adjuvant, based on the total weight of the photoresist composition.

12. A color filter substrate comprising a Black Matrix formed by the photoresist composition prepared in accordance with the method of claim 10.

13. A display apparatus comprising the color filter substrate of claim 12.

* * * * *